US011685004B2

(12) United States Patent
Prochnow et al.

(10) Patent No.: US 11,685,004 B2
(45) Date of Patent: Jun. 27, 2023

(54) SYSTEMS AND METHODS TO DETECT FAULTS IN WIRE FEED MOTOR DRIVE CIRCUITS

(71) Applicant: Illinois Tool Works Inc., Glenview, IL (US)

(72) Inventors: Gregg Donald Prochnow, Hortonville, WI (US); Maxwell Bode Brock, Appleton, WI (US)

(73) Assignee: ILLINOIS TOOL WORKS INC., Glenview, IL (US)

( * ) Notice: Subject to any disclaimer, the term of this patent is extended or adjusted under 35 U.S.C. 154(b) by 0 days.

(21) Appl. No.: 17/199,009

(22) Filed: Mar. 11, 2021

(65) Prior Publication Data

US 2021/0283729 A1 Sep. 16, 2021

Related U.S. Application Data

(60) Provisional application No. 62/989,295, filed on Mar. 13, 2020.

(51) Int. Cl.
*G01R 31/34* (2020.01)
*B23K 37/00* (2006.01)
(Continued)

(52) U.S. Cl.
CPC ............ *B23K 37/006* (2013.01); *B23K 9/125* (2013.01); *G01R 31/34* (2013.01); *H02H 9/02* (2013.01);
(Continued)

(58) Field of Classification Search
CPC ...... G01R 31/34; B23K 37/006; B23K 9/125; H02H 9/02
See application file for complete search history.

(56) References Cited

U.S. PATENT DOCUMENTS 3,942,111 A * 3/1976 Pfouts .................. G01R 31/343
324/754.29
4,521,672 A * 6/1985 Fronius .................. B23K 9/091
219/130.33

(Continued)

FOREIGN PATENT DOCUMENTS

CN 102744500 A * 10/2012
CN 210181177 U * 3/2020
(Continued)

OTHER PUBLICATIONS

Spoolmate™ 100 Series, Owner's Manual, OM-234016G, 2018-03, Miller Electric Mfg. LLC.

(Continued)

*Primary Examiner* — Patrick Assouad
*Assistant Examiner* — Demetrius R Pretlow
(74) *Attorney, Agent, or Firm* — McAndrews, Held & Malloy, Ltd.

(57) ABSTRACT

An example welding-type system includes: processing circuitry; and a machine readable storage medium comprising a machine readable instruction, when executed by the processing circuitry, cause the processing circuitry to: control a first switch to disconnect a motor circuit from a motor power source, the motor circuit comprising a wire feed motor and a second switch; control the second switch to permit current to flow while the first switch disconnects the motor circuit from the motor power source during a test period; and in response to feedback indicative of a current through the motor circuit while the first switch is open and the second switch is closed, detecting a fault condition associated with the motor circuit.

17 Claims, 5 Drawing Sheets

(51) Int. Cl.
  *B23K 9/12* (2006.01)
  *H02H 9/02* (2006.01)
  *G01R 15/14* (2006.01)
  *G01R 15/20* (2006.01)
  *G01R 15/18* (2006.01)

(52) U.S. Cl.
  CPC .......... *G01R 15/146* (2013.01); *G01R 15/181* (2013.01); *G01R 15/202* (2013.01)

(56) References Cited

U.S. PATENT DOCUMENTS

| | | | | | |
|---|---|---|---|---|---|
| 4,727,320 | A | * | 2/1988 | Brennan | G01R 31/34 324/545 |
| 4,996,477 | A | * | 2/1991 | Keeler | G01R 31/34 324/73.1 |
| 6,204,479 | B1 | * | 3/2001 | Sickels | B23K 9/124 219/137.71 |
| 2004/0159489 | A1 | * | 8/2004 | Toda | B62D 5/0463 180/446 |
| 2006/0207979 | A1 | * | 9/2006 | Daniel | B23K 9/0956 219/130.01 |
| 2009/0173726 | A1 | * | 7/2009 | Davidson | G05B 19/414 219/130.01 |
| 2009/0313549 | A1 | * | 12/2009 | Casner | B23K 9/0953 715/740 |
| 2010/0060222 | A1 | * | 3/2010 | Kezobo | G01R 31/52 318/490 |
| 2011/0220629 | A1 | * | 9/2011 | Mehn | B65H 51/30 219/136 |
| 2012/0160897 | A1 | * | 6/2012 | Enyedy | B65H 51/10 228/8 |
| 2012/0241417 | A1 | * | 9/2012 | Mehn | B23K 9/0956 219/108 |
| 2013/0293988 | A1 | * | 11/2013 | Li | H02P 29/027 361/30 |
| 2014/0251965 | A1 | * | 9/2014 | Wiryadinata | B23K 9/1043 219/130.1 |
| 2014/0326706 | A1 | * | 11/2014 | Dunahoo | B23K 9/173 219/137.2 |
| 2017/0050258 | A1 | * | 2/2017 | Hillen | B23K 9/1043 |
| 2017/0282275 | A1 | * | 10/2017 | Nikou | B23K 9/16 |

FOREIGN PATENT DOCUMENTS

| | | | | |
|---|---|---|---|---|
| EP | 2253409 | A1 | * 11/2010 | ............ B23K 9/32 |
| GB | 2538948 | A | * 12/2016 | ......... G01R 15/202 |
| JP | H0531577 | A | * 2/1993 | |
| JP | 2009178747 | A | * 8/2009 | |
| JP | 2013063052 | A | * 4/2013 | |

OTHER PUBLICATIONS

Millermatic® 211, Owner's Manual, OM265809B 2016-01, Miller Electric Mfg. LLC.

* cited by examiner

SYSTEMS AND METHODS TO DETECT FAULTS IN WIRE FEED MOTOR DRIVE CIRCUITS

RELATED APPLICATIONS

The present application claims the benefit of U.S. Patent Application Ser. No. 62/989,295, filed Mar. 13, 2020, entitled "SYSTEMS AND METHODS TO DETECT FAULTS IN WIRE FEED MOTOR DRIVE CIRCUITS." The entirety of U.S. Patent Application Ser. No. 62/989,295 is expressly incorporated herein by reference.

BACKGROUND

This disclosure relates generally to welding systems and, more particularly, systems detecting wiring faults between welding power and wire feed motor circuitry.

Welding systems often have both a welding power supply to produce the electrical arc required to create a weld as well as a secondary power supply to drive a wire feed motor for continuously providing a consumable wire to the weld site. In some applications, the wire feed motor is located within the welding torch unit. These welding torches also often use a single cable that houses both a cable to provide the welding power from the welding power supply to the torch as well as the wiring to provide power from the secondary power supply to the wire feed motor. These composite systems can potentially fail as a result of a short circuit between the welding power cable and the motor power wiring. Traditional systems using standard overcurrent protective devices, such as fuses, have been found to inadequately protect the welding system components based on this type of fault.

SUMMARY

Systems and methods to detect faults in wire feed motor drive circuits are disclosed, substantially as illustrated by and described in connection with at least one of the figures, as set forth more completely in the claims.

BRIEF DESCRIPTION OF THE DRAWINGS

The figures are not to scale. Where appropriate, the same or similar reference numerals are used in the figures to refer to similar or identical elements.

DETAILED DESCRIPTION

Figure 1:
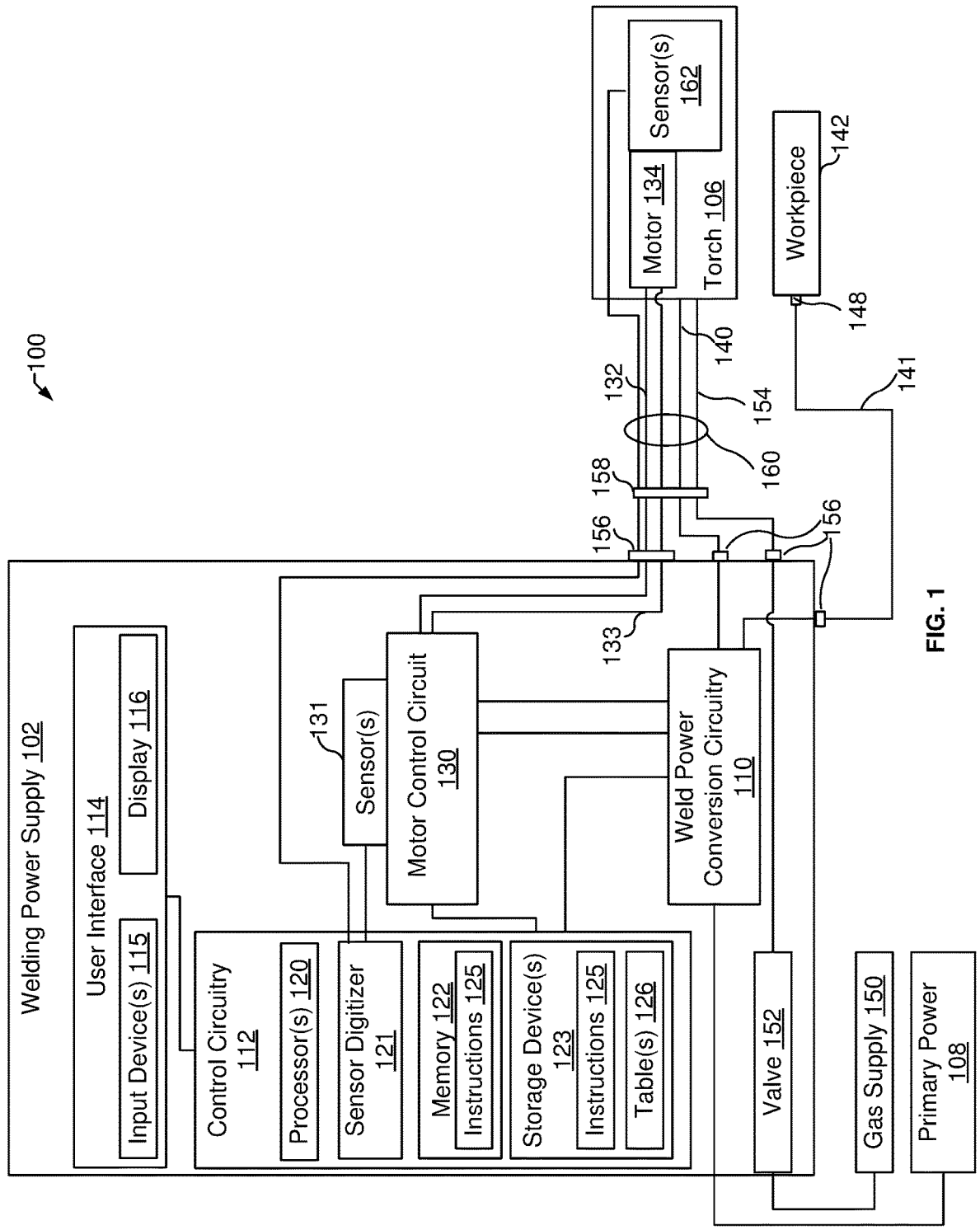
FIG. 1 is a block diagram of an example welding system including a welding-type power supply configured to output welding-type power to a welding-type circuit, in which one or more wire feed motors draw power from the welding-type circuit, in accordance with aspects of this disclosure.

Some continuously fed welding systems reduce cost by deriving the drive power for the wire feed motor(s) from the weld circuit. However, such designs makes the motor drive circuit more vulnerable to fault conditions in which the weld circuit becomes short circuited to the motor circuit (referred to herein as "weld circuit faults"). Weld circuit faults have been observed to be more likely to occur when using a spoolgun type welding torch, in which the leads to provide power to the motor are in the same cable as the welding circuit conductor, and are external to the welding power source.

The result of weld circuit faults may include exposure of the wire feed motor and/or the motor control circuit to significant overcurrents. Costs associated with repairing or replacing equipment resulting from such weld circuit faults are undesirable. Furthermore, weld circuit faults are not immediately observable to a user of the system. In an attempt to continue work, the user may connect the equipment that is experiencing the fault to other equipment, leading to damage to additional equipment.

Some conventional welding systems include protective electrical components, such as fuses, to protect against over motor overcurrent conditions. However, these protective devices are designed and optimized for failures of the motor or motor drive itself, such as a motor in a stalled condition. However, such protective electrical components alone have shown to be unable to protect the various components from damage caused by currents associated with weld circuit faults.

Disclosed are example systems and methods to test for the fault conditions in wire feed motor circuits, such as the weld fault conditions described above. In some example systems and methods, a welding-type power supply performs a circuit test on the motor control circuit to detect weld circuit faults. In response to identifying such faults, disclosed systems and methods may take action to prevent application of overcurrents to the motor and/or notify the user of the identified fault. By performing a controlled test, a welder may be able to test for faulty equipment, such as a faulty spoolgun or push-pull torch, and provide an indication to an operator of the damaged equipment to prompt remedial action.

In disclosed example systems and methods, the fault test involves controlling the voltage and/or current applied to the weld circuit, the time of exposure, and/or the components being potentially exposed to the faulty condition. By controlling one or more of these factors, disclosed example systems and methods reduce the likelihood and/or severity of equipment damage. Further, by identifying a faulty spoolgun via first welding equipment and notifying the operator, the operator is less likely to attach and risk damage to additional welding equipment.

Disclosed methods and apparatus provide a system and method for testing for this fault condition in motor power conversion circuitry. Disclosed example methods and apparatus involve applying a second voltage to the welding torch, disconnecting the motor power supply, and temporarily connecting the motor wiring to the motor power conversion circuitry while monitoring for current using a feedback device (e.g., sensor) in the motor wiring in a welding control circuitry device. Disclosed example methods and apparatus take action to de-energize or disconnect various portions of the electrical circuits, notify a user, and/or take another action in response to detecting a fault to the motor power conversion circuitry.

As used herein, the terms "first," "second," "third," etc., are used to enumerate instances of similar or identical elements, and do not indicate or imply order unless an order is specifically identified.

As used herein, a "circuit" includes any analog and/or digital components, power and/or control elements, such as a microprocessor, digital signal processor (DSP), software, and the like, discrete and/or integrated components, or portions and/or combinations thereof. The terms "control circuit," "control circuitry," and/or "controller," as used herein, may include digital and/or analog circuitry, discrete and/or integrated circuitry, microprocessors, digital signal processors (DSPs), and/or other logic circuitry, and/or associated software, hardware, and/or firmware. Control circuits or control circuitry may be located on one or more circuit boards that form part or all of a controller, and are used to control a welding process, a device such as a power source, and/or any other type of welding-related system.

As used herein, the term "memory" includes volatile and non-volatile memory devices and/or other storage device.

As used herein, the term "switch" includes any device designed to selectively allow or prevent current flow through a circuit. Example switches include various types of transistors that can be operated by the control circuit, such as field effect transistors (FETs), bipolar junction transistors (BJTs), and/or any other type of switch.

As used herein, "power conversion circuitry" and/or "power conversion circuits" refer to circuitry and/or electrical components that convert electrical power from one or more first forms (e.g., power output by a generator) to one or more second forms having any combination of voltage, current, frequency, and/or response characteristics. The power conversion circuitry may include power limiting circuitry, output selection circuitry, measurement and/or control circuitry, and/or any other circuits to provide appropriate features.

As used herein, the term "welding-type power" refers to power suitable for welding, plasma cutting, induction heating, CAC-A and/or hot wire welding/preheating (including laser welding and laser cladding). As used herein, the term "welding-type power supply" and/or "power supply" refers to any device capable of, when power is applied thereto, supplying welding, plasma cutting, induction heating, CAC-A and/or hot wire welding/preheating (including laser welding and laser cladding) power, including but not limited to inverters, converters, resonant power supplies, quasi-resonant power supplies, and the like, as well as control circuitry and other ancillary circuitry associated therewith.

As used herein, the term "primary power" includes any appropriate power source for a welding system. This would include a dedicated welding generator, a generator designed for multiple uses, utility power, or any other equivalent power source commonly known to those skilled in the art.

As used herein, the term "torch," "welding torch," "welding tool" or "welding-type tool" refers to a device configured to be manipulated to perform a welding-related task, and can include a hand-held welding torch, robotic welding torch, gun, gouging tool, cutting tool, or other device used to create the welding arc.

As used herein, the term "welding mode," "welding process," "welding-type process" or "welding operation" refers to the type of process or output used, such as current-controlled (CC), voltage-controlled (CV), pulsed, gas metal arc welding (GMAW), flux-cored arc welding (FCAW), gas tungsten arc welding (GTAW), shielded metal arc welding (SMAW), spray, short circuit, CAC-A, gouging process, cutting process, and/or any other type of welding process.

Disclosed example welding-type systems include processing circuitry and a machine readable storage medium comprising machine readable instructions. The instructions, when executed by the processing circuitry, cause the processing circuitry to: control a first switch to disconnect a motor circuit from a motor power source, the motor circuit comprising a wire feed motor and a second switch; control the second switch to permit current to flow while the first switch disconnects the motor circuit from the motor power source during a test period; and, in response to feedback indicative of a current through the motor circuit while the first switch is open and the second switch is closed, detecting a fault condition associated with the motor circuit.

Some example welding-type systems further include a current sensor configured to output the feedback based on measuring the current. In some examples, the motor circuit further includes a shunt resistor, and the current sensor is configured to measure the current based on a voltage across the shunt resistor. In some examples, the current sensor includes at least one of a Hall effect sensor, a shunt resistor, or a Rogowski coil.

Some example welding-type systems further include a voltage sensor configured to measure a voltage across at least a portion of the motor circuit as the feedback, in which the machine readable instructions configured to cause the processing circuitry detect the fault condition based on comparing the voltage to a threshold voltage. Some examples further include a motor feedback circuit having a sensor configured to output the feedback. In some examples, the sensor includes at least one of a voltage sensor, a current sensor, a torque sensor, a position sensor, or a rotation sensor.

Some example welding-type systems further include first power conversion circuitry configured to convert input power to welding-type power having a welding-type voltage, and second power conversion circuitry, the second power conversion circuitry configured to output a second voltage less than the welding-type voltage, in which the machine readable instructions further cause the processing circuitry to connect the first power conversion circuitry to the motor circuit to perform a welding-type operation, and disconnect the first power conversion circuitry from the motor circuit and connect the second power conversion circuitry to the motor circuit during the test period. In some examples, the machine readable instructions further cause the processing circuitry to output an alert in response to determining a fault condition.

In some examples, the machine readable instructions further cause the processing circuitry to, in response to detecting the feedback signal, control the welding-type system in a weld disable condition including at least one of: opening the first switch to prevent connection of the motor power source to the motor circuit, opening the second switch to prevent current flow through the motor; controlling the motor power source to de-energize the motor; or controlling a power conversion circuitry to turn off an output of the power conversion circuitry. In some such examples, the machine readable instructions cause the processing circuitry to maintain the weld disable condition until a reset input is received.

In some example welding-type systems, the wire feed motor is installed on a spoolgun type welding torch or a push-pull welding torch. In some examples, the test period is less than 100 milliseconds. In some such examples, the test period is less than 15 milliseconds. Some example welding-type systems further include a current limiting device in series with the motor circuit. In some examples, the current limiting device includes at least one of a fast acting fuse, a PTC thermistor, a circuit breaker, or a GFCI circuit.

In some example welding-type systems, the machine readable instructions further cause the processing circuitry to control the first switch, control the second switch, and attempt to detect the fault condition in response to identifying a trigger pull input from a welding torch. Some example welding-type systems further include a motor power conversion circuit configured to convert at least a portion of welding-type power to motor drive power and to output the motor drive power to drive the wire feed motor. In some examples, the machine readable instructions further cause the processing circuitry to control the wire feed motor by modulating the motor drive power using at least one of the first switch or the second switch.

Turning now to the drawings, FIG. 1 is a block diagram of an example welding system 100 having a welding-type power supply 102 and a welding torch 106. The welding system 100 powers, controls, and/or supplies consumables to a welding application. In the example of FIG. 1, the power supply 102 directly supplies welding-type output power to the welding torch 106. The welding torch 106 is a spoolgun type welding torch configured for gas metal arc welding (GMAW), which may be used to perform welding processes involving DC welding-type current, pulsed DC welding-type current waveforms, and/or AC waveforms. Example DC pulse waveforms that may be output by the power supply 102 have a peak phase at a peak current and a background phase at a background current, and one pulse cycle includes one peak phase and one background phase.

The power supply 102 receives primary power 108 (e.g., from the AC power grid, an engine/generator set, a battery, or other energy generating or storage devices, or a combination thereof), conditions the primary power, and provides an output power to one or more welding devices in accordance with demands of the system 100. The primary power 108 may be supplied from an offsite location (e.g., the primary power may originate from the power grid). The power supply 102 includes power conversion circuitry 110, which may include transformers, rectifiers, switches, and so forth, capable of converting the AC input power to AC and/or DC output power as dictated by the demands of the system 100 (e.g., particular welding processes and regimes). The power conversion circuitry 110 converts input power (e.g., the primary power 108) to welding-type power based on a target amperage (e.g., a weld current setpoint) and outputs the welding-type power via a weld circuit.

The power supply 102 includes control circuitry 112 to control the operation of the power supply 102. The power supply 102 also includes a user interface 114. The control circuitry 112 receives input from the user interface 114, through which a user may choose a process and/or input desired parameters (e.g., a voltage, a current, a frequency, pulse peak current time, a pulse peak current percentage, a pulse background current time, a pulse background current percentage, an AC waveform type, an AC balance, a weld circuit inductance, etc.). The user interface 114 may receive inputs using one or more input devices 115, such as via a keypad, keyboard, physical buttons, switches, knobs, a mouse, a keyboard, a keypad, a touch screen (e.g., software buttons), a voice activation system, a wireless device, etc. Furthermore, the control circuitry 112 controls operating parameters based on input by the user as well as based on other current operating parameters. Specifically, the user interface 114 may include a display 116 for presenting, showing, or indicating, information to an operator.

The control circuitry 112 includes at least one controller or processor 120 that controls the operations of the power supply 102. The control circuitry 112 receives and processes multiple inputs associated with the performance and demands of the system 100. The processor 120 may include one or more microprocessors, such as one or more "general-purpose" microprocessors, one or more special-purpose microprocessors and/or application specific integrated circuits (ASICs), and/or any other type of processing device. For example, the processor 120 may include one or more digital signal processors (DSPs).

The example control circuitry 112 includes one or more storage device(s) 123 and one or more memory device(s) 122. The storage device(s) 123 (e.g., nonvolatile storage) may include ROM, flash memory, a hard drive, and/or any other suitable optical, magnetic, and/or solid-state storage medium, and/or a combination thereof. The storage device 123 stores data (e.g., data corresponding to a welding application), instructions (e.g., software or firmware to perform welding processes), and/or any other appropriate data. Examples of stored data for a welding application include predetermined relationships between frequency and amperage, such as one or more look up tables, as described in more detail below.

The memory device 122 may include a volatile memory, such as random access memory (RAM), and/or a nonvolatile memory, such as read-only memory (ROM). The memory device 122 and/or the storage device(s) 123 may store a variety of information and may be used for various purposes. For example, the memory device 122 and/or the storage device(s) 123 may store processor executable instructions 125 (e.g., firmware or software) for the processor 120 to execute. In addition, one or more control regimes for various welding processes, along with associated settings and parameters, may be stored in the storage device 123 and/or memory device 122.

The example control circuitry 112 includes one or more sensor digitizer(s) 121 or other sensor monitoring circuit. The sensor digitizer(s) 121 receive signals from one or more sensor(s) 131 and 162, and convert those signal into format compatible with the control circuitry 112. As will be discussed further, the sensor(s) 131 may include current sensors, voltage sensors, and/or any other type known to those skilled in the art.

In some examples, a gas supply 150 provides shielding gases, such as argon, helium, carbon dioxide, and so forth, depending upon the welding application. The shielding gas flows to a valve 152, which controls the flow of gas, and if desired, may be selected to allow for modulating or regulating the amount of gas supplied to a welding application. The valve 152 may be opened, closed, or otherwise operated by the control circuitry 112 or manually to enable, inhibit, or control gas flow (e.g., shielding gas) through the valve 152. Shielding gas exits the valve 152 and flows through a hose 154 (which in some implementations may be packaged with the welding power output) to the welding torch 106, which provides the shielding gas to the welding application. In some examples, the welding system 100 does not include the gas supply 150, the valve 152, and/or the hose 154.

The example welding torch 106 delivers the welding power, consumable electrode wire, and/or shielding gas for a welding application. The welding torch 106 is used to establish a welding arc between the welding torch 106 and a workpiece 142. A welding cable 140 couples the torch 106 to the weld power conversion circuitry 110 to conduct current to the torch 106. A work cable 141 couples the workpiece 146 to the power supply 102 (e.g., to the weld power conversion circuitry 110) to provide a return path for the weld current (e.g., as part of the weld circuit). The example work cable 141 is attachable and/or detachable from the power supply 102 for ease of replacement of the work cable 141. The work cable 141 may be terminated with a clamp 148 (or another power connecting device), which couples the power supply 102 to the workpiece 142.

In some examples, one or more welding torch sensors 162 are included with or connected to the welding torch 106 to monitor one or more welding parameters (e.g., power, voltage, current, inductance, impedance, etc.) to inform the control circuitry 112 through the sensor digitizer 121 during the welding process. In some examples, one or more sensors 131 may be connected to the connectors 156 of the welding power supply 102 to determine the type and capabilities of welding torch 106 attached to allow the control circuitry 112 to select the appropriate instructions 125.

In some examples, the weld power conversion circuitry 110 provides power to a motor control circuit 130. In the example of FIG. 1, the motor control circuit 130 obtains power from the output of the weld power conversion circuitry 110, such as from the weld circuit and/or directly from the weld power conversion circuitry 110. The motor control circuit 130 converts the weld power to an appropriate power level to power the wire feed motor 134 of the spoolgun type welding torch 106. The motor control circuit 130 transmits current to the wire feed motor 134 via the motor power cables 132 and 133. The motor power cables 132 and 133 may be detachable from the welding power supply 102 for ease of replacement of the wire feed motor 134. The motor power cables 132 and 133 may be packaged with the welding cable 140 and/or the gas supply hose 154. A single connector 156 or multiple connectors 156 may be used to attach the motor power cables 132 and 133, the welding cable 140, and/or the gas supply hose 154 to the welding power supply 102. If multiple connectors are used, the motor power cables 132 and 133, the welding cable 140, and/or the gas supply hose 154 to the welding power supply 102 may be combined at a connection point 158 into a single cable 160 between the welding power supply 102 and the spoolgun type welding torch 106.

To aid a weld operator in configuring the welding-type power supply 102 appropriately (e.g., welding parameters) for an AC waveform or DC pulse process, the example storage device(s) 123 may store tables 126 or other data representative of relationships between frequency and amperage. The tables 126 may define the relationships for different values of other parameters, such as welding circuit inductance, waveform characteristics (e.g., AC waveform shape, peak and/or background current and/or dwell time for pulse, etc), and/or any other variables. The example tables 126 may be populated based on empirical testing using different combinations of welding parameters.

Figure 2A:
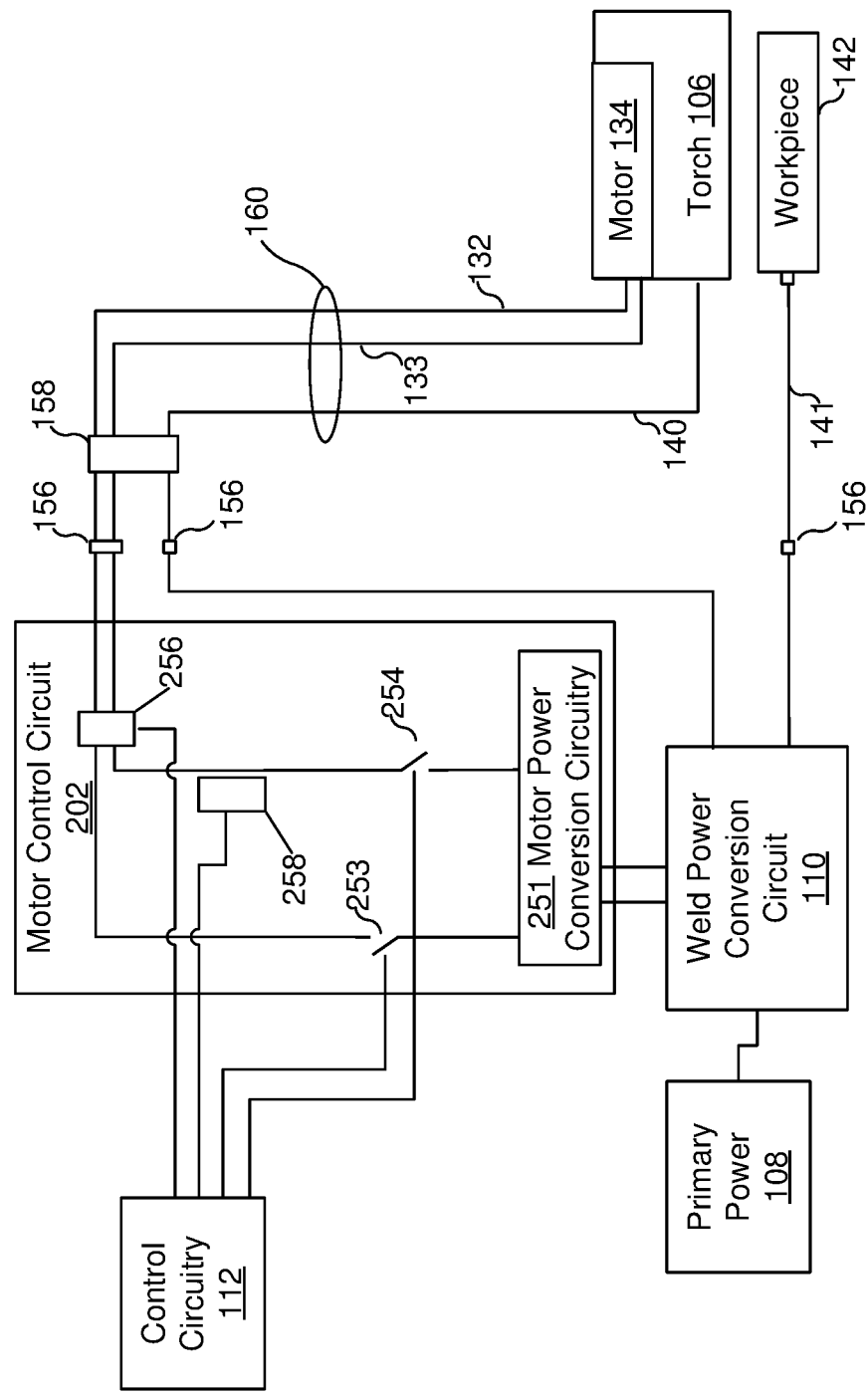
FIG. 2A is a schematic diagram representative of an example motor control circuit that may be used to implement the example motor control circuit of FIG. 1.

Turning to FIG. 2A, the weld power conversion circuitry 110 as mentioned above provides power to the motor power conversion circuit 251. The power converter 251 transforms the higher weld power to a power level appropriate for the wire feed motor 134.

FIG. 2A is a schematic diagram representative of an example motor control circuit 202 that may be used to implement the example motor control circuit 130 of FIG. 1. The motor control circuit 202 is configured to convert power output by the weld power conversion circuitry 110 (e.g., power derived from the welding circuit) to drive the wire feed motor 134, and to control output of the motor power to the torch 106. The example motor control circuit 202 of FIG. 2A includes motor power conversion circuitry 251, a motor power source switch 253, a motor power return switch 254, and one or more sensor(s) 256, 258. The example motor control circuit 202 selectively outputs the motor power to the torch 106 via the connectors 156, the motor power supply cable 132, and the motor power return cable 133.

To run the wire feed motor 134, the motor power conversion circuitry 251 provides motor drive power. The motor power source switch 253 closes allowing current to flow to the wire feed motor 134 via the motor power supply cable 132. The current returns to the motor power conversion circuit 251 through the motor power return cable 133 and through the motor power return switch 254 which was also closed to complete the electrical circuit.

In the example of FIG. 2A, the motor power source switch 253 and motor power return switch are operated by the control circuitry 112 based on the signals sent via the control circuit switch wiring. The control circuitry 112 may control the motor power source switch 253 and/or the motor power return switch 254 using one or more modulation schemes (e.g., pulse width modulation (PWM)) to control a speed of the motor 134 (e.g., to control a wire feed speed during a welding operation). For example, the control circuitry 112 may control the motor 134 by modulating the motor drive power output by the motor power conversion circuit 251 using at least one of the motor power source switch 253 and/or the motor power return switch 254. The control circuitry 112 of FIG. 1 determines the appropriate power level to provide a given wire feed rate to the wire feed motor 134 based on user request through the input device(s) 115, the sensors 131, and the applicable instructions 125.

Additionally or alternatively, the control circuitry 112 may control the motor power return switch 254 to disable the motor 134 in the event of overcurrent detection. In examples in which the motor control circuit 130 is used to drive multiple available wire feed motors (e.g., a spoolgun motor or an integrated wire feed motor in the power supply 102) and each of the wire feed motors is coupled to a separate motor power return switch 254, the control circuitry 112 may control the motor power return switches 254 to control which of the wire feed motors is used for a welding operation.

As previously mentioned, the welding cable 140 may be located adjacent the motor power cables 132 and 133, such as in the same cable 160 A weld circuit fault may occur when the insulation between the welding cable 140 and either of the cables 132, 133, enabling current from the weld power conversion circuitry 110 to flow through the welding cable 140, through one or both of the motor power cables 132 and 133, and/or to the motor control circuit 130.

To identify a weld circuit fault, the control circuitry 112 can be used to perform a test cycle based on the appropriate instructions 125 to selectively energize certain portions of the weld power circuitry 110 and the motor power circuitry 202. By controlling the sequence of operation components and certain parameters of a test cycle, the control circuitry 112 will be able to monitor for the fault condition using the appropriate sensors 131. Based on the test cycle, the control circuitry 112 detects the fault condition prior to damage to the motor control circuit 202.

In one example of the test cycle of the system of FIG. 2A, the control circuitry 112 controls the motor power source switch 253 preventing current from flowing to the motor power source 252 (e.g., to open the circuit). The control circuitry 112 also closes the motor power return switch 254 during the test cycle, and determines whether feedback (e.g., from one or more sensors 256, 258) indicates current flow in the motor circuit. Because the motor power conversion circuitry 251 is isolated by the motor power source switch 253, an indication of current flow through any portion of the motor circuit (e.g., the motor 134, the cables 132 and 133, etc.) suggests the presence of a weld circuit fault, resulting in a power source other than the motor power source 252 being connected to the motor power conversion circuitry 251. In the welding system 100 of FIG. 2A, the weld power conversion circuitry 110 may energize the torch 106 through the weld power cable 140 to provide the alternate power source for the test cycle.

Various types of sensors and methods can be used to determine whether current is flowing through the motor power circuitry. Although some of these sensors and methods will be described further in depth, one skilled in the art would recognize based on the doctrine of equivalence, the scope is not limited to the provided examples. Further, the locations of sensor test points described and identified are meant to only provide individual examples.

In one example of the test cycle of the circuit of FIG. 2A described above, current through the motor 134 is detected with a voltage sensor 256 by measuring the voltage across the motor 134 at the motor power cables 132 and 133 and comparing the measured voltage to a threshold voltage representative of a weld fault condition. Additionally or alternatively, the current through the motor power return cable 133 could be measured using a current sensor 258. The current sensor 258 could include a non-contact current sensor such as a Hall effect sensor, a shunt resistor, or a Rogowski coil.

Figure 2B:
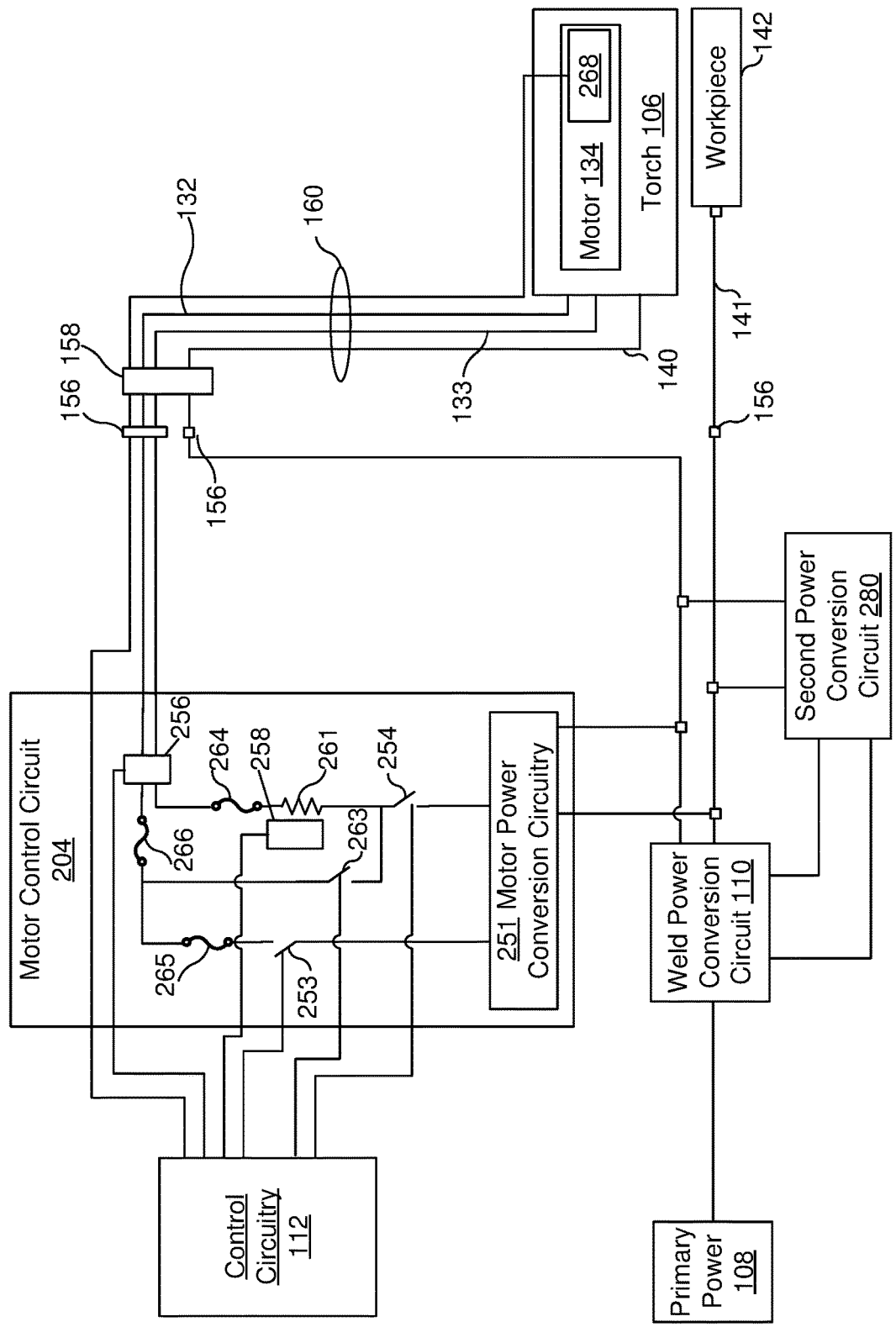
FIG. 2B is a schematic diagram representative of another example motor control circuit that may be used to implement the example motor control circuit of FIG. 1.

FIG. 2B is a schematic diagram representative of another example motor control circuit 204 that may be used to implement the example motor control circuit 130 of FIG. 1. The example motor control circuit 204 includes the motor power conversion circuitry 251, the switches 253, 254, and the sensors 256, 258 described above with reference to FIG. 2A.

The motor control circuit 204 of FIG. 2B further includes a motor brake switch 263. To operate the wire feed motor 134, the control circuitry 112 controls the motor power source switch 253 to close, to allow current to flow to the wire feed motor 134 via the motor power supply cable 132. The current returns to the motor power conversion circuit 251 through the motor power return cable 133 and through the motor power return switch 254 which was also closed to complete the electrical circuit.

The motor brake switch 263 opens during the operation of the wire feed motor 134. At the end of the wire feed motor 134 operation cycle, the motor power source switch 253 and the motor power return switch 254 open and the motor brake switch 263 closes. However, the motor brake switch 263 and the motor power return switch 254 may be configured in other ways to permit discharge of energy by the motor. The motor brake switch 263 helps control deceleration of the wire feed motor 134 at the end of a feed cycle and/or aids in the ability of an operator to manually rotate the wire feed motor 134 when not in use.

During a test cycle in a circuit with a motor brake switch 263, the control circuitry 112 opens the motor power source switch 253 preventing current from flowing to the motor power source 252 and opens the motor brake switch 263. The control circuitry 112 closes the motor power return switch 254.

In some examples, the motor control circuit 130 may include various resistors. As seen in FIG. 2B, the motor control circuit 130 may use a shunt resistor 261 in series with the wire feed motor 134 and the motor power return switch 254. The shunt resistor 261 provides another method of measuring the current through the circuit. The current sensor 258 could measure voltage across the shunt resistor 261 to provide the current feedback to the control circuitry 112.

In some examples, the motor control circuit 130 includes one or more current limiting devices 264, 265, 266. The example current limiting devices 264, 265, 266 may be one or more of a fast acting fuse, a PTC thermistor, a circuit breaker, a GFCI circuit, and/or any other current limiting element or circuit. The example current limiting devices 264, 265, 266 may serve two functions. First, during normal operating conditions, the current limiting devices 264, 265, 266 may provide the motor power conversion circuitry 251 over current protection in cases such as a stalled wire feed motor 134. Second, during the test cycle, the current limiting devices 264, 265, 266 may further limit the current through the motor power conversion circuitry 251 to further minimize damage to the individual components by limiting the potential surge of current resulting from a fault.

In some examples, the welding power supply 102 may have a second power conversion circuit 280 designed to produce a lower power than the primary weld power conversion circuitry 110. In some welding power supplies, the second power conversion circuit 280 may have multiple functions. An example primary function of the second power conversion circuit 280 may include providing an output voltage to detect contact between an electrode in the weld circuit (e.g., at the torch 106) and the workpiece 142, such as a lift arc starting circuit. The example control circuitry 112 may control the second power conversion circuit 280 to output a lower voltage during the test cycle of the motor control circuit 130 to thereby limit the voltage and/or current to which the wire feed motor 134 circuit is exposed.

In some examples, the control circuitry 112 may control additional switches to disconnect the power conversion circuitry 110 from the motor control circuit 204 and connect the second power conversion circuitry 280 to the motor control circuit 204 during the test period.

In some examples, the weld power conversion circuitry 110 provides power to the second power conversion circuit 280 as shown in FIG. 2B. In other examples, the second power conversion circuit 280 could receive power from the primary power 108 or another power source.

In some examples, the wire feed motor 134 may have motor feedback sensors 268 in the form of feedback circuitry internal or adjacent to the wire feed motor 134. These motor feedback sensors 268 may include one or more of a voltage sensor, a current sensor, a torque sensor, a position sensor, or a rotation sensor. During welding operations, the control circuitry 112 may use such sensor(s) to help control the speed of the wire feed motor 134. During the fault test cycle, the sensor(s) 268 could be used to detect the weld circuit fault condition based on the current flow through the wire feed motor 134 and/or the resulting movement of the wire feed motor 134.

Figure 3A:
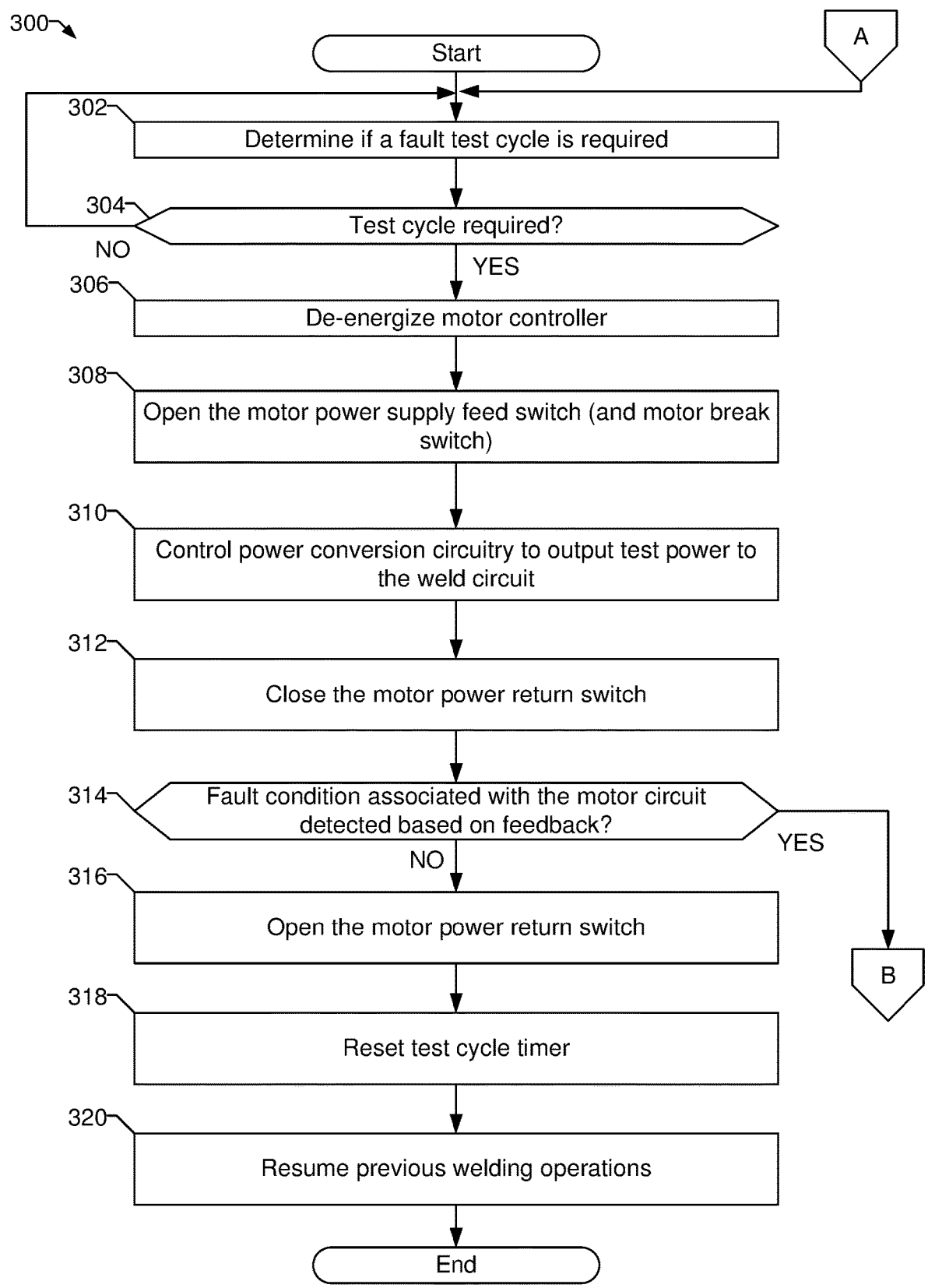
FIGS. 3A-3B illustrate a flowchart representative of example machine readable instructions which may be executed by the example welding power supplies of FIGS. 1, 2A, and/or 2B to monitor for faults in a motor control circuit, and to protect the welding-type system in response to detecting a fault in the motor control circuit.
Figure 3B:
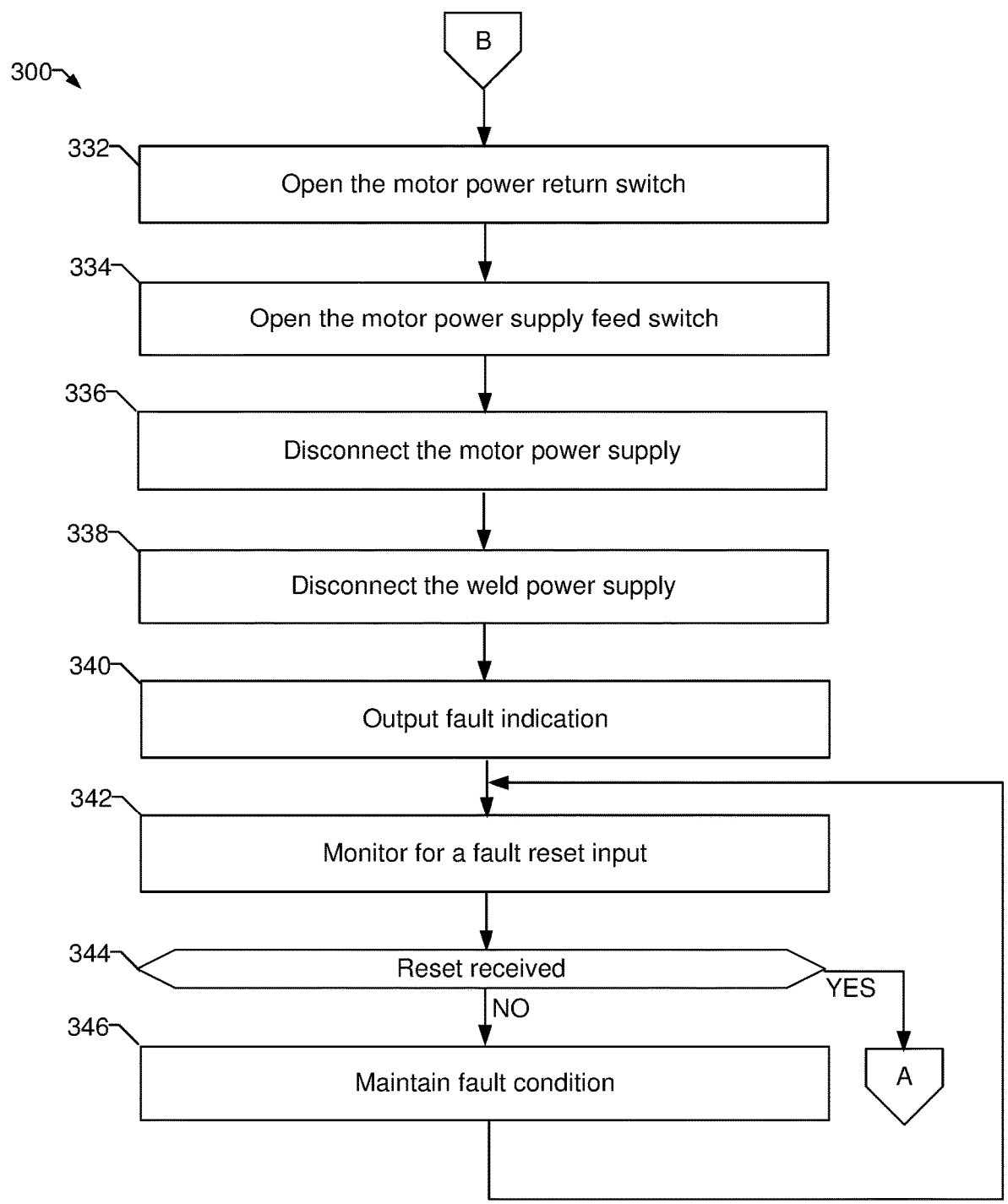

FIGS. 3A-3B illustrate a flowchart representative of example machine readable instructions 300 which may be executed by the control circuitry 112 of the example welding power supply 102 of FIGS. 1, 2A, and 2B to monitor for a fault condition of the example motor control circuits 130, 202, and 204. The example instructions 300 are described below with reference to FIG. 2A.

At block 302, the control circuitry 112 determines if a fault test cycle is to be performed. For example, the control circuitry 112 may run a test cycle prior to providing power to the wire feed motor 134, such as in response to detecting a pull of a trigger of the torch 106. Additionally or alternatively, the control circuitry 112 may run a test cycle when the control circuitry 112 is energized and/or when a different welding mode is selected. The control circuitry 112 may also run a test cycle at a given time interval, such as once every five minutes (or other regular interval).

If a test cycle is not required (block 304), control returns to block 302 to continue monitoring for conditions associated with executing a fault test cycle.

If a test cycle is required (block 304), at block 306 the control circuitry 112 de-energizes the motor control circuit 130. As previously mentioned, de-energizing the motor control circuit 130 may help to protect the motor control circuit 130 if a weld fault condition exists. The control circuitry 112 de-energizes the motor control circuit 130 by opening the motor power conversion supply power disconnect switches 284 and 285 of FIG. 2B. By having the motor control circuit 130 in a de-energized state, the potential weld voltage from weld power conversion circuitry 110 via the welding cable is less likely to cause damage to the motor control circuit 130 than if energized. The control circuitry 112 de-energizes the motor controller by opening the motor power conversion supply power disconnect switches 284 and 285 of FIG. 2B.

At block 308, the control circuitry 112 controls the motor power source switch 253 to disconnect the motor circuit (e.g., the motor 134, the motor power return switch 254), and if present, the motor brake switch 263. With the motor power source switch 253 open, the motor control circuit 130 is further isolated from a fault condition.

At block 310, the control circuitry 112 applies test power (e.g., a test voltage, a test current, etc.) to the weld circuit (e.g., the welding cable 140 and the work cable 141). In some examples, such as the circuit of FIG. 2A, the control circuitry 112 controls the weld power conversion circuitry 110 to output the test power. In some examples such as FIG. 2B, the control circuitry 112 controls the second power conversion circuit 280 to output the test power.

At block 312, the control circuitry 112 controls the motor power return switch 254 to permit current to flow (e.g., close) while the motor power supply feed switch remains open (e.g., disconnecting the motor 134 from the motor power conversion circuitry 251). If a weld fault condition exists between the motor circuit (e.g., the cables 132, 133) and the weld circuit, the closing of the motor power return switch 254 will allow current to flow from the welding power supply 102, through the welding cable 140, through the fault location, and through the motor power return cable 133 to the motor power return switch 254. The current may also pass through the wire feed motor 134 and/or the motor power feed cable 132.

At block 314, the control circuitry 112 determines whether a weld fault condition associated with the motor circuit exists, based on feedback indicative of current flowing through the motor circuit. For example, the control circuitry 112 may detect that a weld fault condition exists if current is flowing through the motor power return switch 254 and/or the wiring leading to the motor power return switch 254. For example, the control circuitry 112 may detect the weld fault condition based on feedback from one or more of the voltage sensor 256, the current sensor 258, and/or the motor feedback sensors discussed above with reference to FIGS. 2A and 2B.

If a weld fault condition is not detected (block 314), at block 316 the control circuitry 112 controls the motor power return switch 254 to prevent current flow (e.g., open circuit). For example, the control circuitry 112 may open the motor power return switch 254 to limit the current or power to which the motor 134 is potentially exposed during the test period. The test period between the times the motor power return switch 254 is closed (block 312) and opened (block 316) may be selected based on a number of factors, including the likelihood of overcurrent damage in the motor 134 and/or reduce the test-caused delay between an operator pulling a trigger and the beginning of wire feeding to begin a weld operation. In some examples, the test period is less than 100 milliseconds. In some such examples, the test period is less than 15 milliseconds. To provide sufficient time for the sensors discussed in block 312 to reliably detect the fault condition, the test period is at least 1 millisecond.

At block 318, the control circuitry 112 resets the test cycle timer to prepare for future test cycles. At block 320, the control circuitry 112 resumes the previous welding operation.

Turning to FIG. 3B, If a weld fault condition is detected (block 314), at block 332 the control circuitry 112 controls the motor power return switch 254 to prevent current flow through the circuit (e.g., open circuit). The control circuitry 112 may open the motor power return switch 254 based on, for example, the test cycle timer or may be a result of the detection of the current.

At block 336, the control circuitry 112 controls the motor controller power supply 251 to prevent output of current by the motor controller power supply 251. At block 338, the control circuitry 112 controls the power conversion circuitry 110 to prevent output of current by the power conversion circuitry 110 (e.g., to prevent or reduce the likelihood of damage to components of the system 100). In weld systems with a second power conversion circuit 280, the control circuitry 112 may also disconnect the second power conversion circuit 280.

At block 340, the control circuitry 112 outputs an alert or other indication to the operator of the fault condition. This indication could be a visual indication and/or an audible indication. For visual indications, the control circuitry 112 may provide an LED warning light or a fault message or code. In some systems, this may indicate to the operator the welding torch 106 has failed and/or not to connect the welding torch to another welding machine. In some examples, the control circuitry 112 outputs audible indications, such as a sound to indicate a fault or a message to identify the type of fault.

In other examples, one or more of blocks 332-340 may be omitted. Additionally or alternatively, the control circuitry 112 may control the switch 263 in a closed or conducting state to reduce or prevent conduction of current to the motor 134.

At block 342, the control circuitry 112 monitors for a reset input. In some systems, the reset input requires a full power down of the welding system. For example, during an initialization or startup routine (e.g., following a power cycle of the power supply 102 or soft reset of the power supply 102), the control circuitry 112 may reset the fault condition. Requiring a full power cycle to reset the fault condition may reduce the likelihood that an operator continues to attempt to use the faulty welding torch before replacement, thereby reducing the likelihood of damage from repeated failed fault test cycles. In some systems, the welding system will have a fault reset button or other input to reset the fault condition and re-enable operation. In response to the fault reset button, the control circuitry 112 may identify fault reset input to the control circuitry 112.

At block 344, the control system determines whether a fault reset input has been received. If a reset input has not been received (block 344), at block 346 the control circuitry 112 maintains the system in the fault state, and returns control to block 342 to continue monitoring for a fault reset input.

When a fault reset input has been received (block 344), control returns to block 302.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. For example, blocks and/or components of disclosed examples may be combined, divided, re-arranged, and/or otherwise modified. Therefore, the present method and/or system are not limited to the particular implementations disclosed. Instead, the present method and/or system will include all implementations falling within the scope of the appended claims, both literally and under the doctrine of equivalents.

What is claimed is:

1. A welding-type system, comprising:
   processing circuitry;
   first power conversion circuitry configured to convert input power to welding-type power having a welding-type voltage;
   second power conversion circuitry, the second power conversion circuitry configured to output a second voltage less than the welding-type voltage; and
   a machine readable storage medium comprising machine readable instructions which, when executed by the processing circuitry, cause the processing circuitry to:
      connect the first power conversion circuitry to a motor circuit to perform a welding-type operation; and
      control a first switch to disconnect the motor circuit from a motor power source, the motor circuit comprising a wire feed motor and a second switch;
      disconnect the first power conversion circuitry from the motor circuit and connect the second power conversion circuitry to the motor circuit during a test period;
      control the second switch to permit current to flow while the first switch disconnects the motor circuit from the motor power source during the test period;
      in response to feedback indicative of a current through the motor circuit while the first switch is open and the second switch is closed, detecting a fault condition associated with the motor circuit.

2. The welding-type system as defined in claim 1, further comprising a current sensor configured to output the feedback based on measuring the current.

3. The welding-type system as defined in claim 2, wherein the motor circuit further comprises a shunt resistor and the current sensor is configured to measure the current based on a voltage across the shunt resistor.

4. The welding-type system as defined in claim 2, wherein the current sensor comprises at least one of a Hall effect sensor, a shunt resistor, or a Rogowski coil.

5. The welding-type system as defined in claim 1, further comprising a voltage sensor configured to measure a voltage across at least a portion of the motor circuit as the feedback, the machine readable instructions configured to cause the processing circuitry to detect the fault condition based on comparing the voltage to a threshold voltage.

6. The welding-type system as defined in claim 1, further comprising a motor feedback circuit comprising a sensor configured to output the feedback.

7. The welding-type system as defined in claim 6, wherein the sensor comprises at least one of a voltage sensor, a current sensor, a torque sensor, a position sensor, or a rotation sensor.

8. The welding-type system as defined in claim 1, wherein the machine readable instructions further cause the processing circuitry to output an alert in response to determining a fault condition.

9. A welding-type system, comprising:
   processing circuitry; and
   a machine readable storage medium comprising machine readable instructions which, when executed by the processing circuitry, cause the processing circuitry to:
      control a first switch to disconnect a motor circuit from a motor power source, the motor circuit comprising a wire feed motor and a second switch;
      control the second switch to permit current to flow while the first switch disconnects the motor circuit from the motor power source during a test period;
      in response to feedback indicative of a current through the motor circuit while the first switch is open and the second switch is closed, detecting a fault condition associated with the motor circuit; and
      in response to detecting the feedback, control the welding-type system in a weld disable condition including at least one of:
         opening the first switch to prevent connection of the motor power source to the motor circuit,
         opening the second switch to prevent current flow through the motor;
         controlling the motor power source to de-energize the motor; or
         controlling a power conversion circuitry to turn off an output of the power conversion circuitry.

10. The welding-type system as defined in claim 9, wherein the machine readable instructions cause the processing circuitry to maintain the weld disable condition until a reset input is received.

11. The welding-type system as defined in claim 1, wherein the wire feed motor is installed on a spoolgun type welding torch or a push-pull welding torch.

12. The welding-type system as defined in claim 1, wherein the test period is less than 100 milliseconds.

13. The welding-type system as defined in claim 12, wherein the test period is less than 15 milliseconds.

14. The welding-type system as defined in claim 1, further comprising a current limiting device in series with the motor circuit.

15. The welding-type system as defined in claim 14, wherein the current limiting device comprises at least one of a fast acting fuse, a PTC thermistor, a circuit breaker, or a GFCI circuit.

16. The welding-type system as defined in claim 1, wherein the machine readable instructions further cause the processing circuitry to control the first switch, control the second switch, and attempt to detect the fault condition in response to identifying a trigger pull input from a welding torch.

17. A welding-type system, comprising:
processing circuitry;
a motor power conversion circuit configured to convert at least a portion of welding-type power to motor drive power and to output the motor drive power to drive the wire feed motor; and
a machine readable storage medium comprising machine readable instructions which, when executed by the processing circuitry, cause the processing circuitry to:
control a first switch to disconnect a motor circuit from a motor power source, the motor circuit comprising a wire feed motor and a second switch;
control the second switch to permit current to flow while the first switch disconnects the motor circuit from the motor power source during a test period;
in response to feedback indicative of a current through the motor circuit while the first switch is open and the second switch is closed, detecting a fault condition associated with the motor circuit; and
control the wire feed motor by modulating the motor drive power using at least one of the first switch or the second switch.

\* \* \* \* \*